United States Patent
Petilli

(10) Patent No.: US 10,600,187 B2
(45) Date of Patent: Mar. 24, 2020

(54) TRAJECTORY DETECTION DEVICES AND METHODS

(71) Applicant: OWL AUTONOMOUS IMAGING, INC., Fairport, NY (US)

(72) Inventor: Eugene M. Petilli, Victor, NY (US)

(73) Assignee: OWL AUTONOMOUS IMAGING, INC., Fairport, NY (US)

(*) Notice: Subject to any disclaimer, the term of this patent is extended or adjusted under 35 U.S.C. 154(b) by 0 days.

(21) Appl. No.: 16/358,873

(22) Filed: Mar. 20, 2019

(65) Prior Publication Data

US 2019/0295264 A1    Sep. 26, 2019

Related U.S. Application Data

(60) Provisional application No. 62/645,617, filed on Mar. 20, 2018.

(51) Int. Cl.
  *G06T 7/20* (2017.01)
  *H04N 5/225* (2006.01)
  *H01L 27/146* (2006.01)
  *H01L 31/0352* (2006.01)
  *H01L 31/024* (2014.01)

(52) U.S. Cl.
  CPC .......... *G06T 7/20* (2013.01); *H04N 5/22541* (2018.08); *G06T 2200/21* (2013.01); *G06T 2207/10024* (2013.01); *G06T 2207/10028* (2013.01); *G06T 2207/10036* (2013.01); *G06T 2207/10048* (2013.01); *G06T 2207/10052* (2013.01); *G06T 2207/30241* (2013.01); *H01L 27/14618* (2013.01); *H01L 27/14627* (2013.01); *H01L 27/14636* (2013.01); *H01L 27/14669* (2013.01); *H01L 31/024* (2013.01); *H01L 31/035218* (2013.01)

(58) Field of Classification Search
  CPC .................. H04N 5/22541; G06T 2207/10052
  See application file for complete search history.

(56) References Cited

U.S. PATENT DOCUMENTS

| | | | |
|---|---|---|---|
| 7,417,718 B2 | 8/2008 | Wada et al. | |
| 8,588,516 B2 | 11/2013 | Nagasaka et al. | |
| 8,941,750 B2* | 1/2015 | Yamamoto | H04N 9/045 348/218.1 |

(Continued)

OTHER PUBLICATIONS

International Search Report and Written Opinion for related matter PCT/US19/23087 dated Jun. 5, 2019; 8 pages.

*Primary Examiner* — Paulos M Natnael
(74) *Attorney, Agent, or Firm* — Loza & Loza, LLP

(57) ABSTRACT

A trajectory detection device includes a lens configured to receive an image of a field of view. An array of microlenses is configured to create an array of light field images based on the image. A detector array includes a plurality of photon sensitive photodetectors. The detector array is configured to generate output signals from each photodetector based on the array of light field images. A controller is configured to integrate the output signals over an integration period. At least a portion of the output signals are modulated at a modulating frequency having a modulating frequency cycle time that is smaller than the integration period. A three-dimensional image of motion in the field of view is generated based on the integration of the modulated output signals.

20 Claims, 14 Drawing Sheets

(56) References Cited

U.S. PATENT DOCUMENTS

| | | |
|---|---|---|
| 9,238,165 B2 * | 1/2016 | Marty .................... G06T 7/70 |
| 9,283,431 B2 * | 3/2016 | Marty ................ A63B 24/0003 |
| 9,383,457 B2 | 7/2016 | Lebrun et al. |
| 9,697,617 B2 * | 7/2017 | Marty .................... G06T 7/246 |
| 10,444,136 B2 * | 10/2019 | Barrett .................. A61B 6/037 |
| 2014/0156042 A1 | 6/2014 | Marty et al. |
| 2017/0343460 A1 * | 11/2017 | Barrett ................ A61B 6/4241 |

* cited by examiner

TRAJECTORY DETECTION DEVICES AND METHODS

FIELD

The present disclosure relates to trajectory detection devices and methods of making the same. More specifically, the disclosure relates to plenoptic cameras, wherein a read-out integrated circuit (ROIC) of the plenoptic camera uses modulation to attenuate static information thereby enhancing detection of three dimensional motion of objects.

BACKGROUND

Plenoptic (or light field) cameras are commercially available, but are generally large and require a rack of equipment to capture and process the acquired video frames. Further, light field imaging techniques have not been adapted to applications involving object detection, such as hostile fire. Current methods for object detection generally utilize acoustic, radar or video techniques. While these methods are capable of determining the presence of an object, they are unable to determine the trajectory of the object, or where the object originated from. Thus, current techniques provide limited information during object detection.

Temporal (of or relating to time) filtering techniques also have been explored to provide for trajectory detection. However, such techniques require modulation techniques not currently supported by commercial light field cameras.

SUMMARY

A trajectory detection device includes a lens configured to receive an image of a field of view. An array of microlenses is optically coupled to the lens and configured to create an array of light field images based on the image. A detector array, comprising a plurality of photosensitive detectors (or photodetectors), is optically coupled to the array of microlenses and configured to provide output signals from each photodetector based on the array of light field images. A controller is communicatively coupled to the detector array. The controller is configured to receive the output signals from the detector array. The output signals are integrated over an integration period, wherein at least a portion of the output signals are modulated at a modulating frequency having a modulating frequency cycle time that is smaller than the integration period. A three-dimensional image of optical change in intensity, proportional to change in three-dimensional position within the field of view is generated based on the integration of the modulated output signals, wherein the three-dimensional image trajectory of motion can be calculated using computational photography techniques.

This technology provides a number of advantages including providing a trajectory detection device. The technology utilizes a detector array and a microlens array to potentially provide a light field camera with extended depth-of-field and red/green/blue (RGB)+depth (RGBD) visible light capability or if coupled with infrared detector, IR+depth. The technology further employs temporal filtering applied to the light field images to allow for three-dimensional trajectory detection, including a starting point vector, for an object in motion. The technology may advantageously be utilized in low light and surveillance applications for trajectory detection, including in night vision goggles or gun sights, by way of example only. The technology is also capable of providing RGBD video that enables applications such as three-dimensional mapping that may be utilized, for example, in unmanned drone vehicles. Furthermore, the microlens array may be coupled with a NIR or SWIR detector to provide a NIR+D or SWIR+D capability. When mated with a one or two waveband infra-red detector array (LWIR, MWIR), a temperature+depth light field camera is created useful for ballistic missile tracking or hostile fire detection, by way of example only.

BRIEF DESCRIPTION OF THE DRAWINGS

FIG. 2A depicts a simplified schematic illustration of an exemplary plenoptic camera in accordance with the present invention;

FIG. 2B depicts an enlarged perspective view of the area 2B in FIG. 2A;

DETAILED DESCRIPTION

Certain examples will now be described to provide an overall understanding of the principles of the structure, function, manufacture, and use of the methods, systems, and devices disclosed herein. One or more examples are illustrated in the accompanying drawings. Those skilled in the art will understand that the methods, systems, and devices specifically described herein and illustrated in the accompanying drawings are non-limiting examples and that the scope of the present disclosure is defined solely by the claims. The features illustrated or described in connection with one example may be combined with the features of other examples. Such modifications and variations are intended to be included within the scope of the present disclosure.

The terms "substantially", "approximately", "about", "relatively," or other such similar terms that may be used throughout this disclosure, including the claims, are used to describe and account for small fluctuations, such as due to variations in processing from a reference or parameter. Such small fluctuations include a zero fluctuation from the reference or parameter as well. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Exemplary trajectory detection devices of the present invention may be comprised of a plenoptic camera, also known as a light field camera. The plenoptic camera can provide a variety of capabilities for the detection device that a conventional camera cannot.

A light field is a vector function that describes the amount of light flowing in every direction through every point in space. A plenoptic camera captures information about the light field emanating from an object of interest in the field of view of the plenoptic camera. Such information includes information about the intensity of the light emanating from the object of interest and also information about the direction that the light rays are traveling in space. This contrasts with a conventional camera, which captures only information about light intensity.

Figure 1:
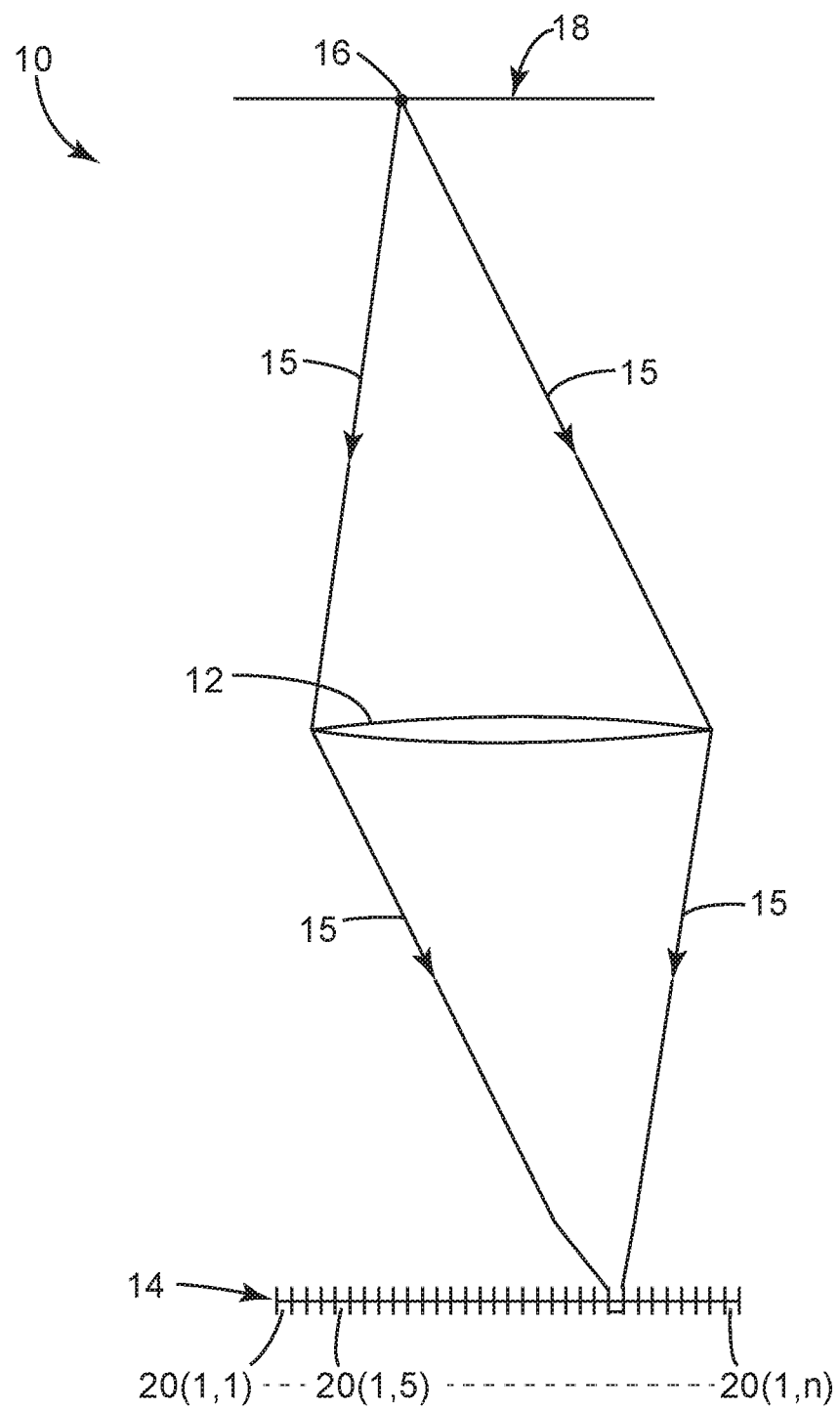
FIG. 1 depicts a simplified schematic illustration of an exemplary prior art conventional digital camera.

Referring to FIG. 1, a simplified schematic illustration of an exemplary prior art conventional digital camera 10 is depicted. The conventional camera includes a main lens 12 and a detector array 14. The main lens 12 maps light photons 15 emanating from a point 16 on an object plane 18 of an object of interest (not shown) onto the detector array 14.

The detector array 14 includes a plurality of photon sensitive photodetectors 20(1, 1) to 20(m, n) arranged in m rows and n columns within the detector array 14. Each photodetector 20 generates an electric signal proportional to the number of photons 15 of light that hits the photodetector 20. As such, there is a one to one mapping of points 16 positioned on the object plane 18 to the photodetectors 20 positioned on the detection array 14. The number of photons 15 hitting a photodetector during one shutter actuation period (or integration period, or frame time) is indicative of the light intensity emanating from the point 16. From this intensity and position data, a two-dimensional picture of an object in the object plane 18 can be derived.

Figures 2A, 2B:
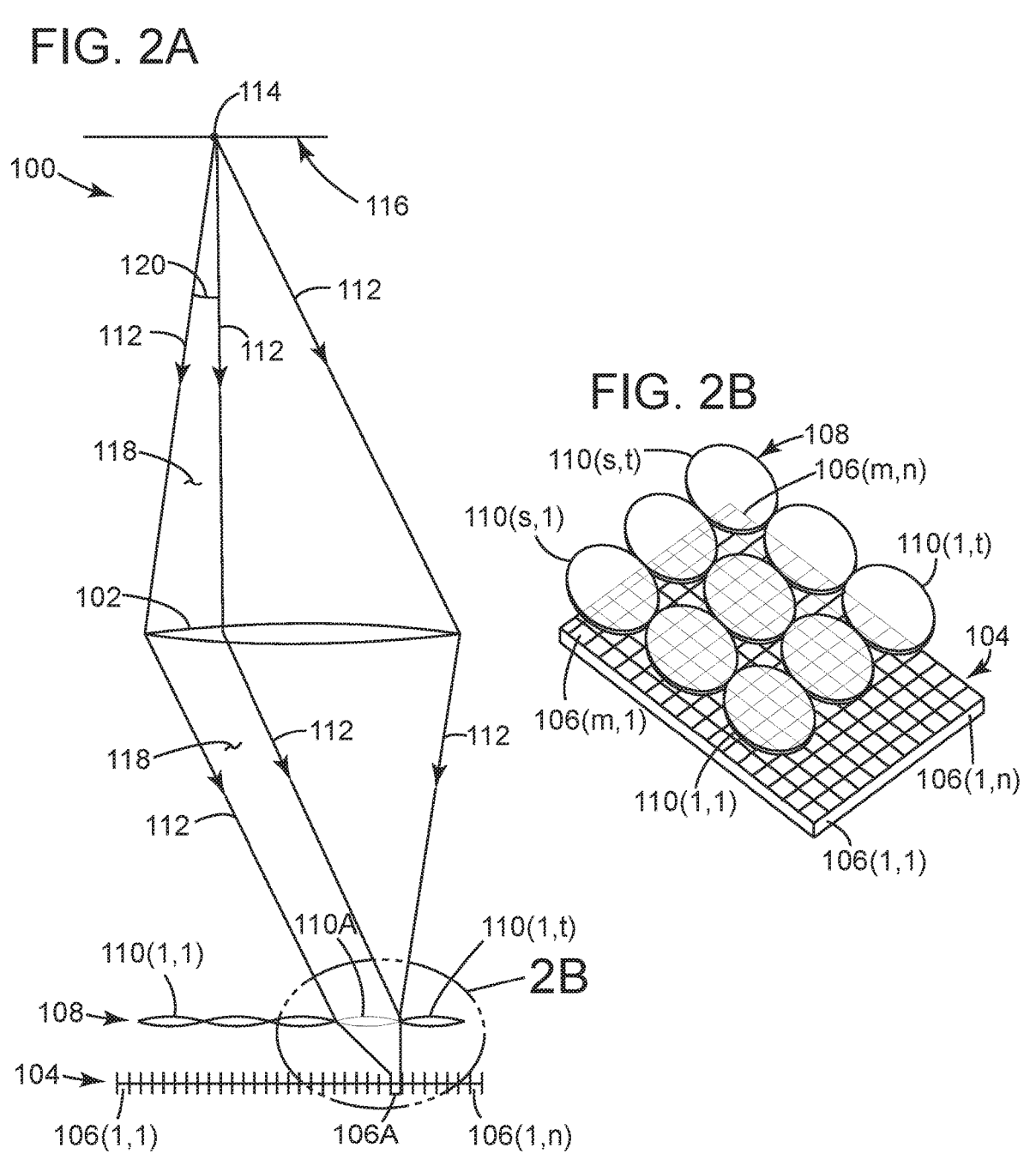

Referring to FIG. 2A, a simplified schematic illustration of an exemplary plenoptic camera 100 in accordance with the present invention is depicted. Similar to the conventional camera 10, the plenoptic camera 100 includes a main lens 102 and a detector array 104 of photodetectors 106. However, the plenoptic camera 100 also includes an array 108 of microlenses 110 positioned between the main lens 102 and the detector array 104. The array 108 of microlenses 110 is generally positioned closer to the detector array 104 than to the main lens 102.

In the plenoptic camera 100, the main lens 102 maps light photons 112 emanating from a point 114 on an object plane 116 of an object of interest (not shown) onto the microlens array 108. The microlens array 108 then maps the light photons 112 onto the detector array 104, which is located on an image plane (also referred to herein as a focal plane) of the plenoptic camera 100.

In this exemplary embodiment, the function of the microlens 110 in the microlens array 108 is to take angular subsets of the light photons 112 and focus those subsets onto specific photodetectors 106. For example, an angular subset 118 of the photons 112 emanating at a specific angle 120 (from the point 114) strikes a specific microlens 110A. Microlens 110A focuses that subset 118 onto several associated photodetectors 106 behind the microlens 110A. The associated photodetectors form a sub-array of photodetectors, such as, by way of a non-limiting example, photodetectors 106A through 106E (best seen in FIG. 4). In other words, each microlens focuses light onto a sub-array of photodetectors where each sub-array includes a portion of the detector elements under the microlens. The sub-array photodetectors may capture substantially all of the light rays (photons) 112 that are traveling within the angular subset 118 from the point 114 to the microlens 110A.

As illustrated in FIG. 2A, photodetector 106A is one such exemplary photodetector of the sub-array of photodetectors. However, there may be many photodetectors 106 that make up a sub-array of photodetectors. For example, there may be 10, 50, 100 or more photodetectors 106 that make up a sub-array of photodetectors associated with each microlens 110.

The microlenses 110 and photodetectors 106 each provide both spatial and perspective information relative to points (such as point 114) on the object plane 116. Spatial information, in this context, being indicative of positions on the object plane 116. Perspective information, in this context, being indicative of angles that light emanates from the object plane 116.

Referring to FIG. 2B, a simplified exemplary perspective view of the area 2B in FIG. 2A in accordance with the present invention is depicted. As can be seen, the microlens array 108 is located directly above the detector array 104. The detector array 104 includes a plurality of the photon sensitive photodetectors 106(1, 1) to 106(m, n) arranged in m rows and n columns within the detector array 104. Additionally, the microlens array 108 includes a plurality of microlenses 110(1, 1) to 110(s, t) arranged in s rows and t columns within the microlens array 108. Each microlens 110 has a plurality of photodetectors 106 associated with it and upon which each microlens 110 will focus light rays 112 emanating at different angles onto a different associated photodetector 106. For example, there may be 10, 20, 100 or more photodetectors 106 positioned directly behind, and associated with, each microlens 110, wherein each associated photodetector 106 receives light rays 112 from the microlens from a different predetermined angle. Each of the photodetectors 106 positioned behind and associated with a specific microlens 110, such that they receive light from that specific microlens 110, are part of the sub-array of photodetectors associated with that specific microlens 110.

Figure 3:
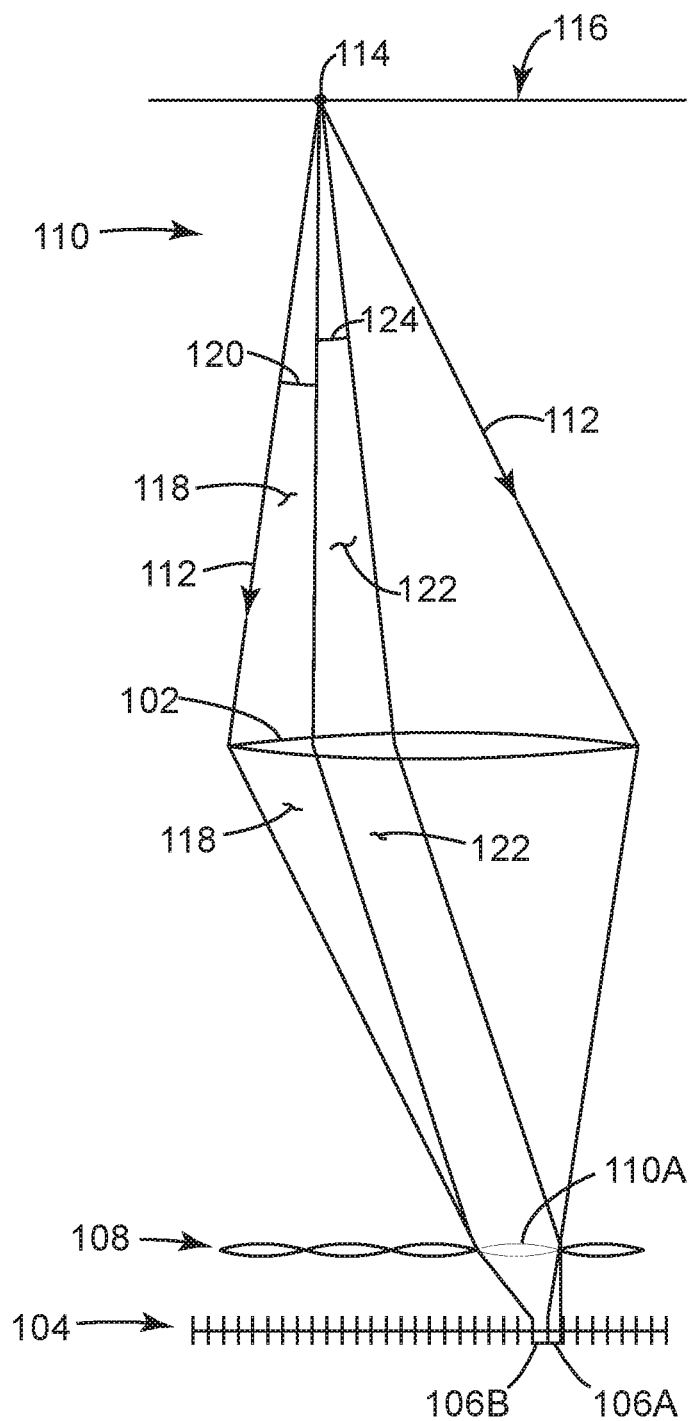
FIG. 3 depicts a simplified schematic illustration of plenoptic camera of FIG. 2A, wherein an additional angular subset of photons is shown in accordance with the present invention.

Referring to FIG. 3, a simplified schematic illustration of the exemplary plenoptic camera 100 of FIG. 2A in accordance with the present invention is depicted, wherein an additional angular subset 122 emanating at a different angle 124 from point 114 is illustrated. The angular subset 122 of photons 112 is also striking microlens 110A. However, because of the way the optics are configured, microlens 110A focuses that subset 122 onto the photodetector 106B adjacent to photodetector 106A. So the photodetector 106B captures substantially all of the light rays (photons) 112 that are traveling within the angular subset 122 from the point 114 to the microlens 110A.

Figure 4:
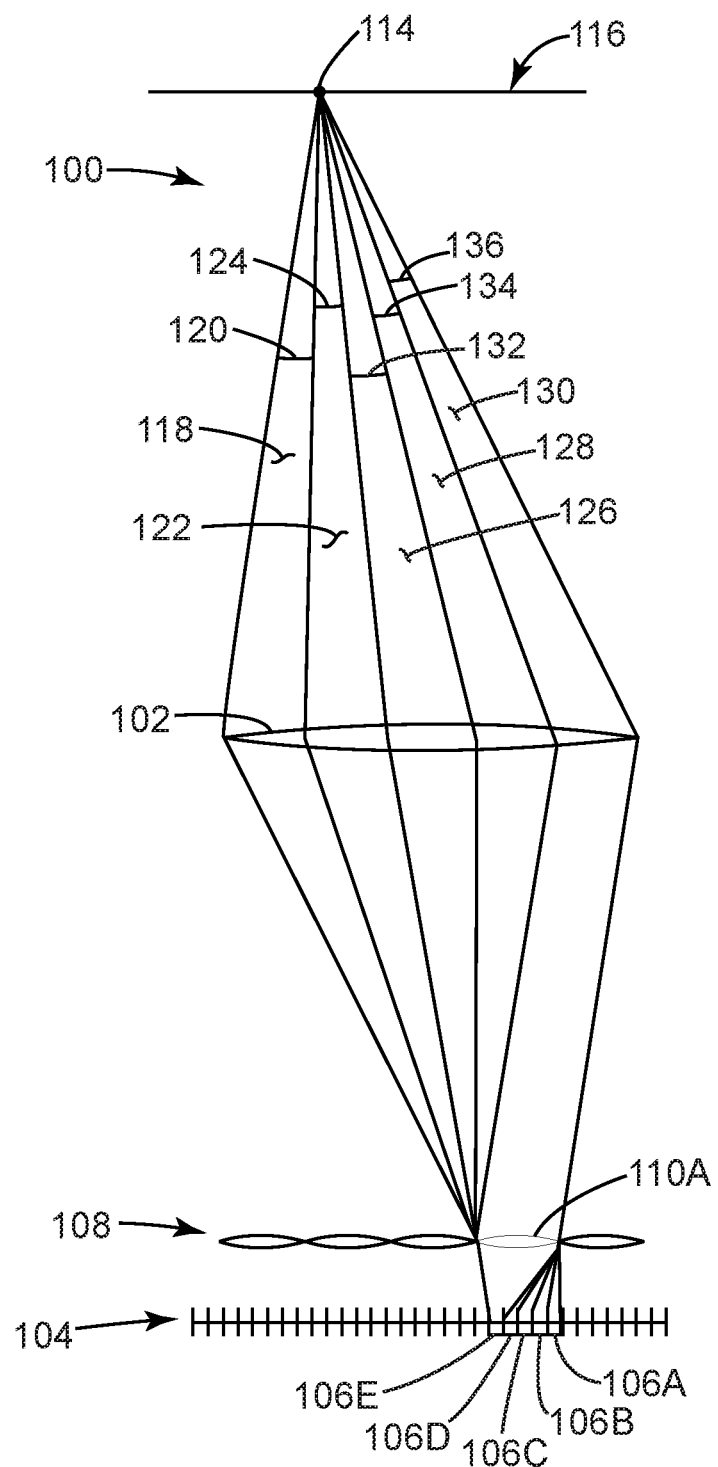
FIG. 4 depicts a simplified schematic illustration of plenoptic camera of FIG. 2A, wherein several additional angular subsets of photons is shown in accordance with the present invention.

Referring to FIG. 4, a simplified schematic illustration of the exemplary plenoptic camera 100 of FIG. 2A in accordance with present invention is depicted, wherein additional angular subsets 126, 128 and 130 emanating at different angles 132, 134 and 136 respectively from point 114 is illustrated. The angular subsets 126, 128, 130 of photons 112 are also striking microlens 110A. Again however, because of the way the optics are configured, microlens 110A focuses those subsets 128, 130, 136 respectively onto the photodetectors 106C, 106D and 106E. So as you move along from each photodetector 106 to the next, it can be seen that the collection of photodetectors 106A to 106E are capturing the intensity of the light rays emanating from the point 114, but are also discretely measuring the different angles from which those light rays emanate from point 114 as well. The combination of photodetectors 106A to 106E form an example of a sub-array of photodetectors associated with microlens 110A.

Accordingly, each microlens 110 in the microlens array 108 represents at least a different perspective of the object plane 116, and each photodetector 106 associated with a microlens 110 represents at least a different angle of light 112 that is striking that microlens. Therefore, the image information captured in the microlenses 110 can be processed, at least microlens by microlens, to determine what position on the object plane light is emanating from. Additionally, the image information captured in the photodetectors can be processed, at least photodetector by photodetector, to determine the angle of light striking the photodetectors.

Figure 5:
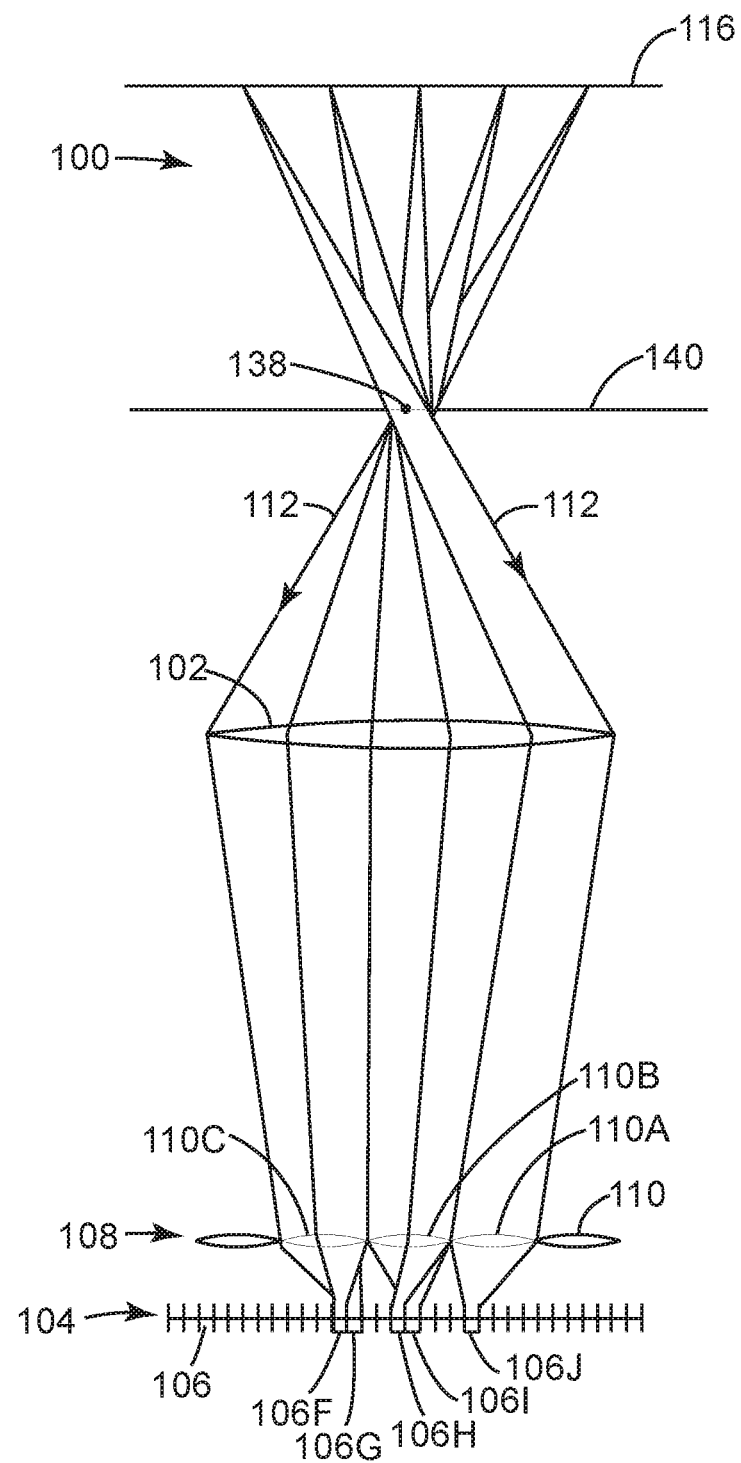
FIG. 5 depicts a simplified schematic illustration of plenoptic camera of FIG. 2A, wherein different collections of photodetectors are combined from different microlenses to form a new focal plane in accordance with the present invention.

Referring to FIG. 5, a simplified schematic illustration of the exemplary plenoptic camera 100 of FIG. 2A in accordance with the present invention is depicted, wherein different collections of photodetectors 106 are combined from different microlenses 110 to form a new object plane 140. More specifically: a first exemplary collections of photodetectors includes 106F and 106G, and is associated with microlens 110C; a second exemplary collection of photodetectors includes 106H and 106I, and is associated with microlens 110B; and a third collection of photodetectors includes photodetector 106J, and is associated with microlens 110A. The collections of photodetectors, in this example, are chosen so that they all correspond to light 112 emanating from a point, or region, 138 on a new object plane 140. Accordingly, wherein the original image information was focused on the object plane 116, the captured information can be reassembled to focus on the new object plane 140. Therefore, in contrast to conventional camera 10, plenoptic camera 100 can adjust the focal plane through software manipulation of the captured data in a single shutter actuation period (i.e., in a single frame). Additionally, the image information captured in a single shutter actuation period of plenoptic camera 100 can be reassembled to provide perspective shifts and three-dimensional depth information in the displayed image. More specifically, with regard to perspective shifts, at least one photodetector 106 may be selected that is associated with each microlens 110, wherein the selected photodetectors 106 all represent substantially the same light angle. As such, a change in view from different perspectives can be generated.

Moreover, with regard to three-dimensional depth information, the different angles represented by the plurality of photodetectors 106 associated with at least two microlens 110 can be utilized to generate three dimensional images using computational photography techniques. Each microlens 110 represents a perspective of a point 114, or region, on an object plane 116 of an object of interest. For three-dimensional depth information, the same point 114 on the object must be processed by at least two micro-lenses 110. Each microlens 110 will direct the photon from the object onto a photodetector 106 within that microlens' field of view. The relative parallax between the receiving photodetectors is a direct result of the difference in the microlenses' difference in perspective of the object.

By way of example, the different photodetector collections associated with different microlens may be combined to provide detailed range and depth information about an object of interest in the object plane 116. For example, the angular and spatial information with photodetectors 106F, 106G (associated with microlens 110C) can be combine with the angular and spatial information of photodetector 106J (associated with microlens 110A) if they view a common point on the object plane 116 to provide a parallax. As such, photodetectors associated with dissimilar microlenses can be utilized to determine detailed three-dimensional range and depth information through computational photography techniques.

Figure 6A:
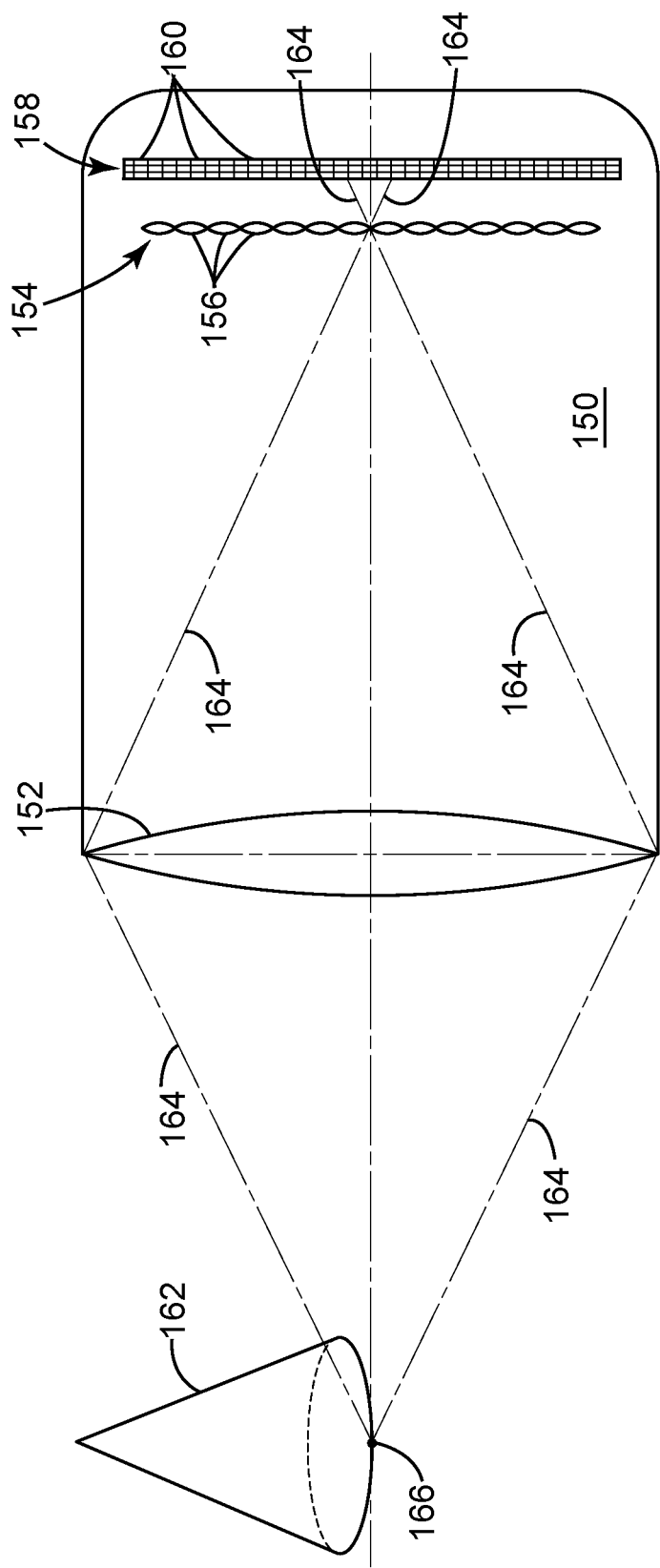
FIG. 6A depicts a simplified schematic illustration of another plenoptic camera in accordance with the present invention, wherein this plenoptic camera is of a type commonly referred to as a plenoptic 1.0 camera.

Referring to FIG. 6A, a simplified schematic illustration of another exemplary plenoptic camera 150 in accordance with the present invention is depicted. This example of a plenoptic camera 150 is often referred to as a plenoptic 1.0 camera. In this illustration, the plenoptic camera 150 is focused on an external object 162.

Plenoptic camera 150 is similar to plenoptic camera 100 in that it includes a main lens 152, a microlens array 154 that includes a plurality of microlenses 156, and a detector array 158 that includes a plurality of photodetectors 160. However, unlike plenoptic camera 100, the detector array 158 of plenoptic camera 150 is not located in a focal plane. Rather, light rays (or photons) 164 that emanate from a point 166 on the object 162 do not focus to a point on the photodetector array 158, but instead are spread over several photodetectors 160. However, the microlenses 156 and photodetectors 160 still contain both spatial and angular data, which enables various images to be derived from computational photography techniques.

Figure 6B:
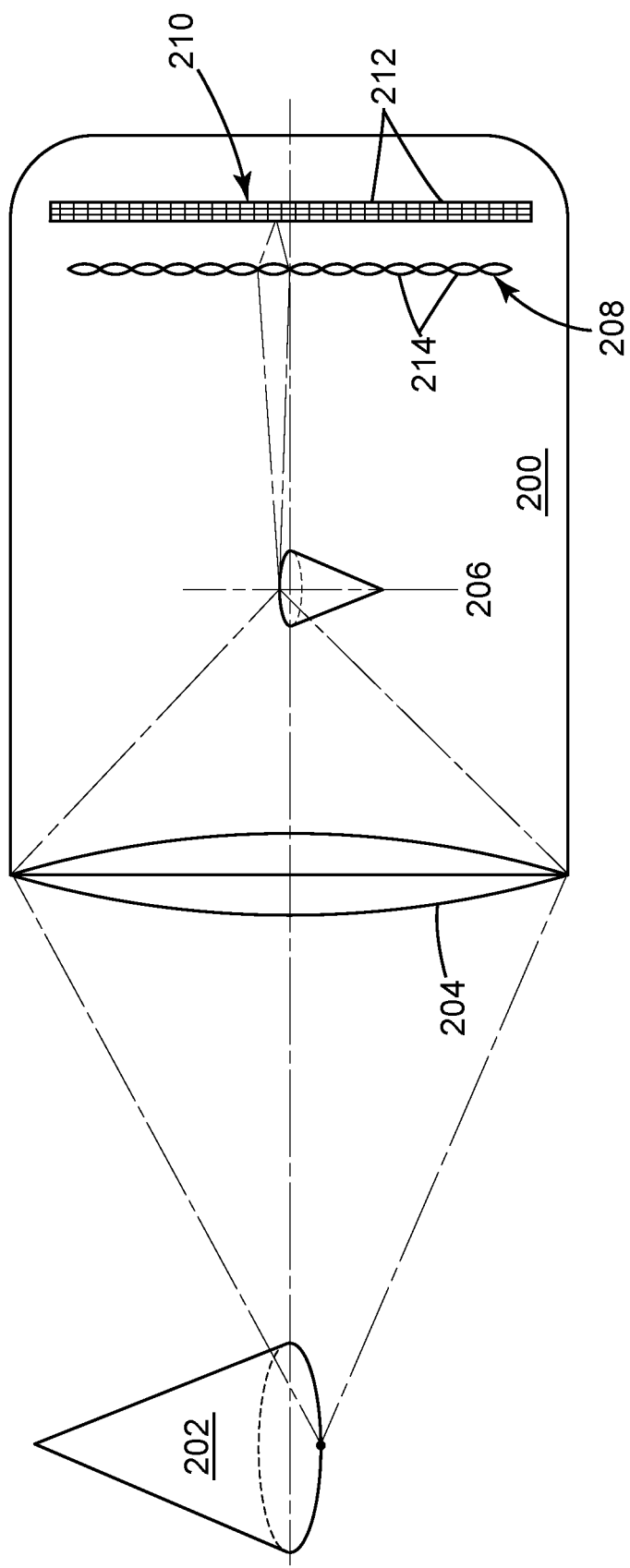
FIG. 6B depicts a simplified schematic illustration of another plenoptic camera in accordance with the present invention, wherein this plenoptic camera is of a type commonly referred to as a plenoptic 2.0 camera.

Referring to FIG. 6B, a simplified schematic illustration of another exemplary plenoptic camera 200 in accordance with the present invention is depicted. This example of a plenoptic camera is often referred to as a plenoptic 2.0 camera. In this illustration, the plenoptic camera 200 is focused on an external object 202.

The external object 202 radiates thermal energy in the form of infrared radiation that is focused by the main (or collecting) lens 204 to an inverted focal plane 206. A microlens array 208 is placed between the image plane 206 and a thermally sensitive detector array 210 at an image plane. The microlens array 208 is comprised of a plurality of microlenses 214 and the detector array 210 is comprised of a plurality of photo sensitive photodetectors 214. In exemplary plenoptic 2.0 camera 200, the microlens array 208 is focused on both the image plane 206 behind it and photodetectors (or photodetectors) 212 ahead of it. In this configuration the Plenoptic camera 200 forms a thermal image on the detector array 210 that is the aggregate result of each microlens' 214 image. Computational imaging (or computational photography) can then reconstruct a single 2D image from the plurality of 2D images superimposed on the detector array 210. Because the position of each microlens 214 is known relative to the photodetectors 210 of the detector array 208, the angle of thermal radiation from each microlens 214 is also known. Accordingly, range and depth information can be determined from the perceived parallax between any two photodetectors 212 viewing the same area of the object 202 through at least two microlenses 214.

A plenoptic camera 200, similar to plenoptic camera 100 and 150, captures information (or data) about the light field emanating from an object of interest in the field of view of the plenoptic camera. Such imaging data includes information about the intensity of the light emanating from the object of interest and also information about the direction that the light rays are traveling in space. Through computational imaging techniques, the imaging data can be processed to provide a variety of images that a conventional camera is not capable of providing. For example, in addition to being able to generate three-dimensional image information of an object of interest, plenoptic camera 200 is also capable of changing focal planes and perspective views on an image captured in a single shutter action (or shutter actuation period) of the camera.

Figure 7:
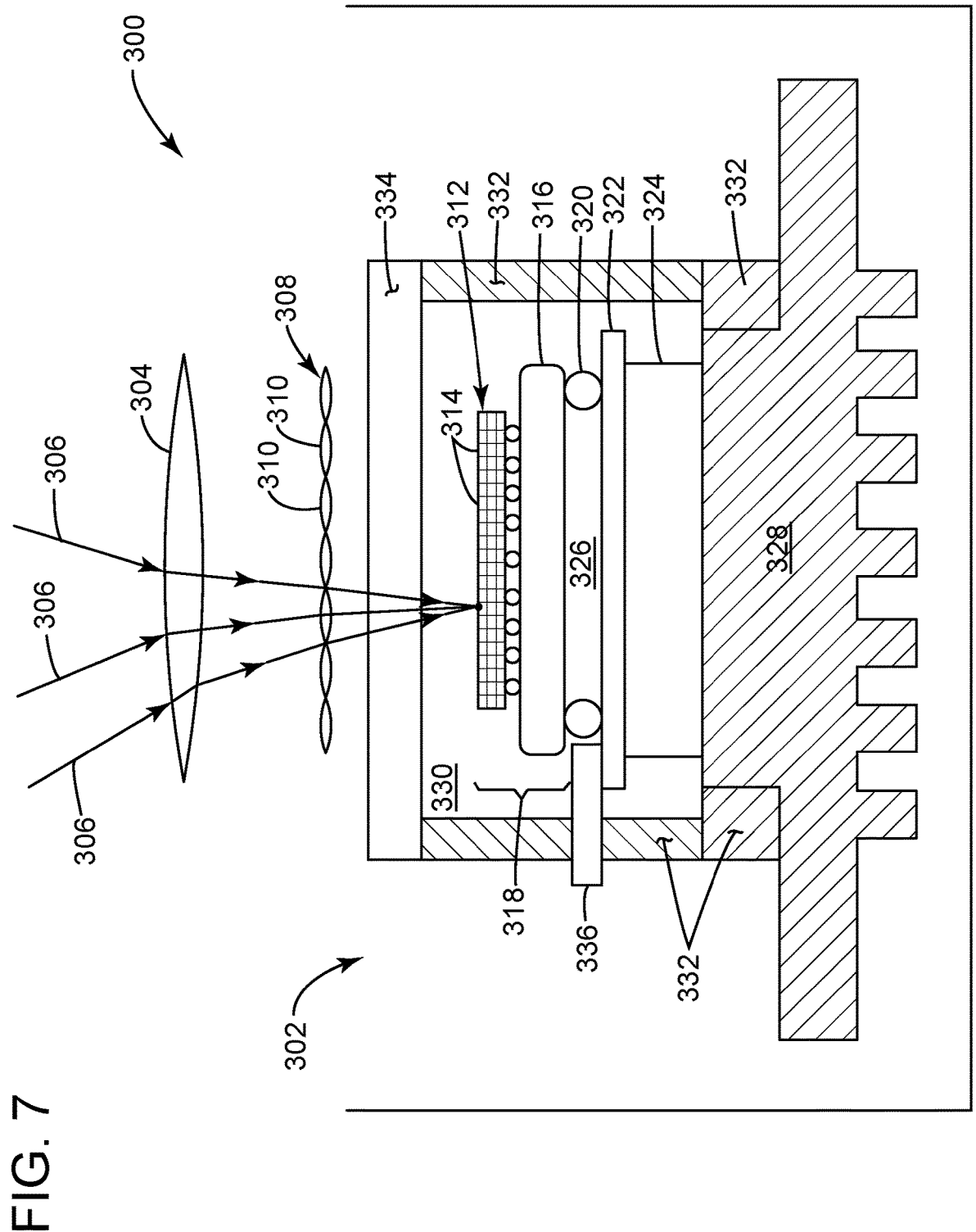
FIG. 7 depicts a simplified schematic illustration of another plenoptic camera in accordance with the present invention.

Referring to FIG. 7, a simplified schematic illustration of another exemplary plenoptic camera 300 in accordance with the present invention is depicted, wherein the plenoptic camera 300 includes a nano integrated detector cooler assembly (IDCA) 302. More specifically, plenoptic camera 300 includes a main lens 304, which collects light photons 306 emanating from an object of interest. The main lens 304 directs the photons 306 onto a microlens array 308 which includes a plurality of microlenses 310. The microlenses 310 focus the light photons 306 onto a detector array 312 within the IDCA 302.

The main components of the IDCA 302 include and infrared window 334, the detector array 312, a read-out integrated circuit (ROIC) 316, a substrate 322, an active cooler 324 and a heat sink 328. The IDCA 302 is contained in a vacuum enclosure 332, such as a Dewar.

The detector array 312 includes a plurality of photosensitive photodetectors 314. Each photodetector 314 generates output signals (i.e., a detector photocurrent) that is based on the number of photons hitting the photodetector 314.

The photodetectors 314 of the detector array 312 may be capable of detecting and producing an output signal for one or more wavebands of light. For example, the detectable wavebands may be in the visible light range, having wavelengths in the range of 400 nm-750 nm. The detectable wavebands may be in the near infrared (NIR) range, having wavelengths in the range of 750 nm-1 μm. The detectable wavebands may be in the short wavelength infrared (SWIR) range, having wavelengths in the range of 1 μm-2.5 μm. The detectable wavebands may be in the medium wavelength infrared range (MWIR), having wavelengths in the range of 3 um-5 um. The detectable wavebands may also be in the long wavelength infrared (LWIR) range, having wavelengths in the range of 8 μm-14 μm. In this particular example, the detector array 312 is capable of detecting MWIR and LWIR wavebands.

The detector array 312 interfaces to the Read Out Integrated Circuit (ROIC) 316 via indium bumps 35. The combination of the detector array 312 and the ROIC 316 comprise a focal plane array (FPA) 318 The basic function of the ROIC 316 is to accumulate and store the detector photocurrent (i.e., the photodetector output signals) from each photodetector and to transfer the resultant signal onto output ports for readout. The basic function of the focal plane array 318 is to convert an optical image into an electronic image.

The ROIC rests upon perimeter CV balls 320 which in turn rest upon substrate 322. In this MWIR LWIR example, the substrate is cooled by the active cooler 324. The active cooler may be, by means of example and not limitation, a Thermo-Electric Cooler (TEC) or a Stirling cooler. Cooling is coupled from the substrate 322 to the ROIC 316 via a thermal underlayer (such as an array of bump bonds) 326, which, by means of example, may be fabricated from indium or low temperature copper. The active cooler 324 is passively cooled and in conductive contact with heat sink 328. To optimize cooling of the detector array 312 the area 330 around the array 312 is held in vacuum and enclosed by an enclosure 332. The enclosure 332 may be for example a Dewar. Infrared radiation 306 (in this case MWIR and LWIR) couples to the detector array 312 through an infrared window 334, which preserves the insulating vacuum and passes infrared energy. Power and signals are passed to and from the IDCA via a vacuum sealed connector 336.

The photodetectors 314 (or photodetectors) of detector array 312 may be photovoltaic (such as photodiodes or other types of devices that generate an electric current due to absorption of light photons) or photoconductive (such as micro-bolometers or other types of devices having an electrical resistance that changes due to absorption of light photons). The photoconductive detectors often have a larger time constant and are often slower to react to light photons than photovoltaic detectors. However the photovoltaic detectors often require cooling to lower temperatures than photovoltaic detectors, although both technologies will enjoy improved performance with cooling.

However, silicon-based photodetectors cannot efficiently detect wavelengths greater than 1 um. Therefore silicon-based photodetectors are generally used to detect wavebands in the visible range (e.g., 400 nm to 750 nm) or NIR range (750 nm to 1 μm). Moreover, non-silicon-based photodetectors are often used as photodetectors for the detection of light in the infrared (IR) ranges, such as the SWIR range (1 μm to 2 μm), the MWIR range (3 μm to 5 μm) or the LWIR range (8 μm to 14 μm). Examples of non-silicon based detector materials that support fabrication of photovoltaic or photoconductive IR detectors include: InGaAs, GaAs, GaSb, InSb, InAs, HgCdTe, and Ge.

However, such non-silicon IR detectors must be cryogenically cooled to minimize thermally generated current. More specifically, such non-silicon IR detectors should be cooled within a range of 77 to 180 Kelvin by the active cooler 324.

Figure 8:
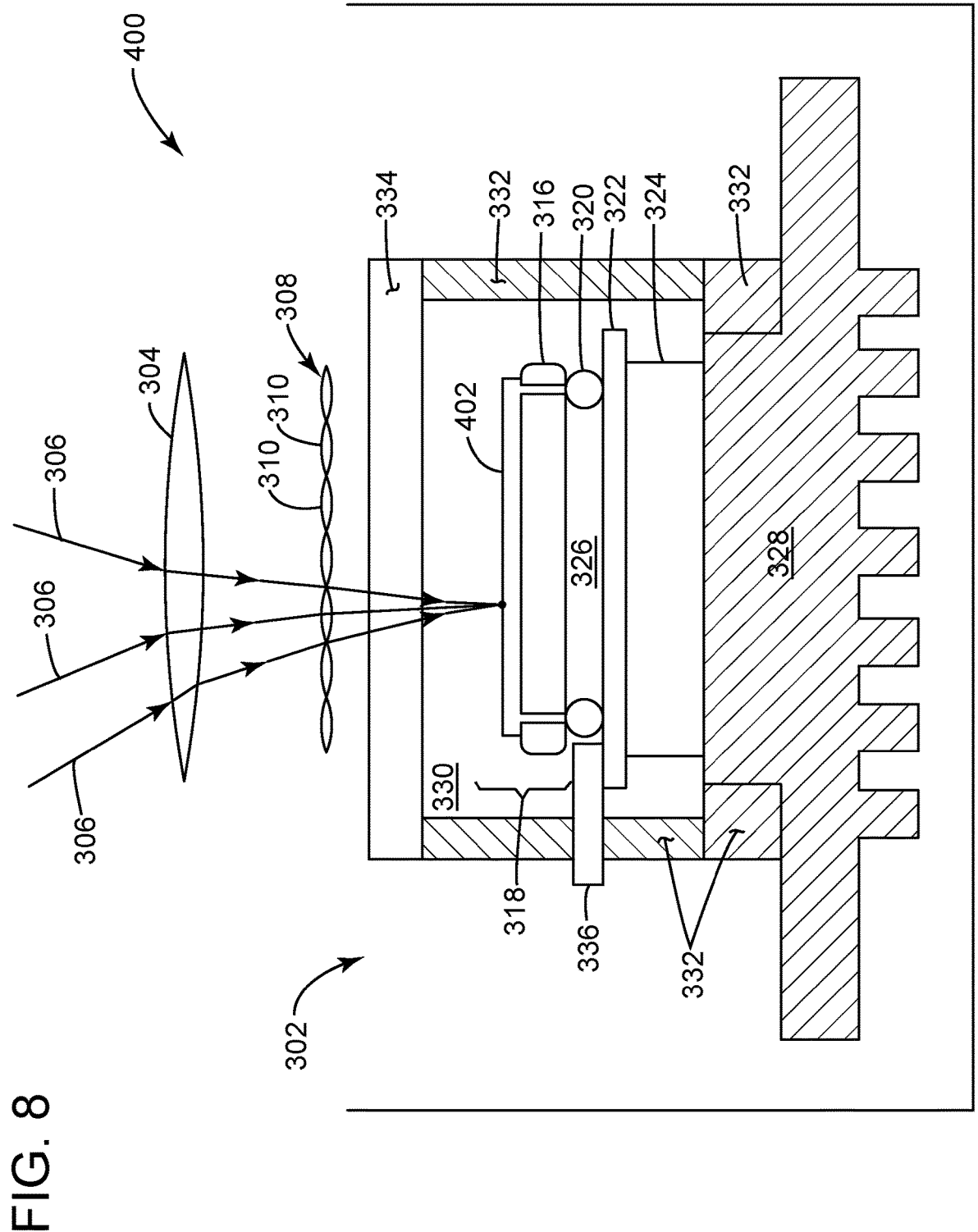
FIG. 8 depicts a simplified schematic illustration of another plenoptic camera in accordance with the present invention.

Referring to FIG. 8, a simplified schematic illustration of another exemplary plenoptic camera 400 in accordance with the present invention is depicted, wherein the detector array 402 is composed of Colloidal Quantum Dots (CQD). CQDs are tiny semiconductor particles a few nanometers in size, having optical and electronic properties. Many types of CQDs, when excited by electricity or light, emit light at frequencies that can be precisely tuned by changing the dots' size, shape and material, therefore enabling a variety of applications. Conversely, CQDs can be made responsive to light, defined by the dots' size, shape and material, so that the CQD material produces electric current in response to illumination.

The CQDs 402 may be applied directly to the ROIC 316. The photosensitive CQD 402 detects incident infrared radiation 306 that passes through the infrared window 334. The rest of the IDCA 302 is substantially the same as the embodiment in FIG. 7 and comprises a thermal underlayer 326 to couple the ROIC 316 to an active cooler 324 where the ROIC 316 is supported by perimeter CV balls 320. The IDCA 302 is enclosed by an enclosure 332 that together with the infrared glass 334 provide a vacuum sealed area 330 around the detector array 402.

One advantage that the CQDs 402 have over other non-silicon based materials, is that they do not have to be cooled as much to minimize thermally generated currents. For example, the CQDs 402 may only have to be cooled to within a range of 200 to 270 Kelvin for acceptable image generation.

Figure 9:
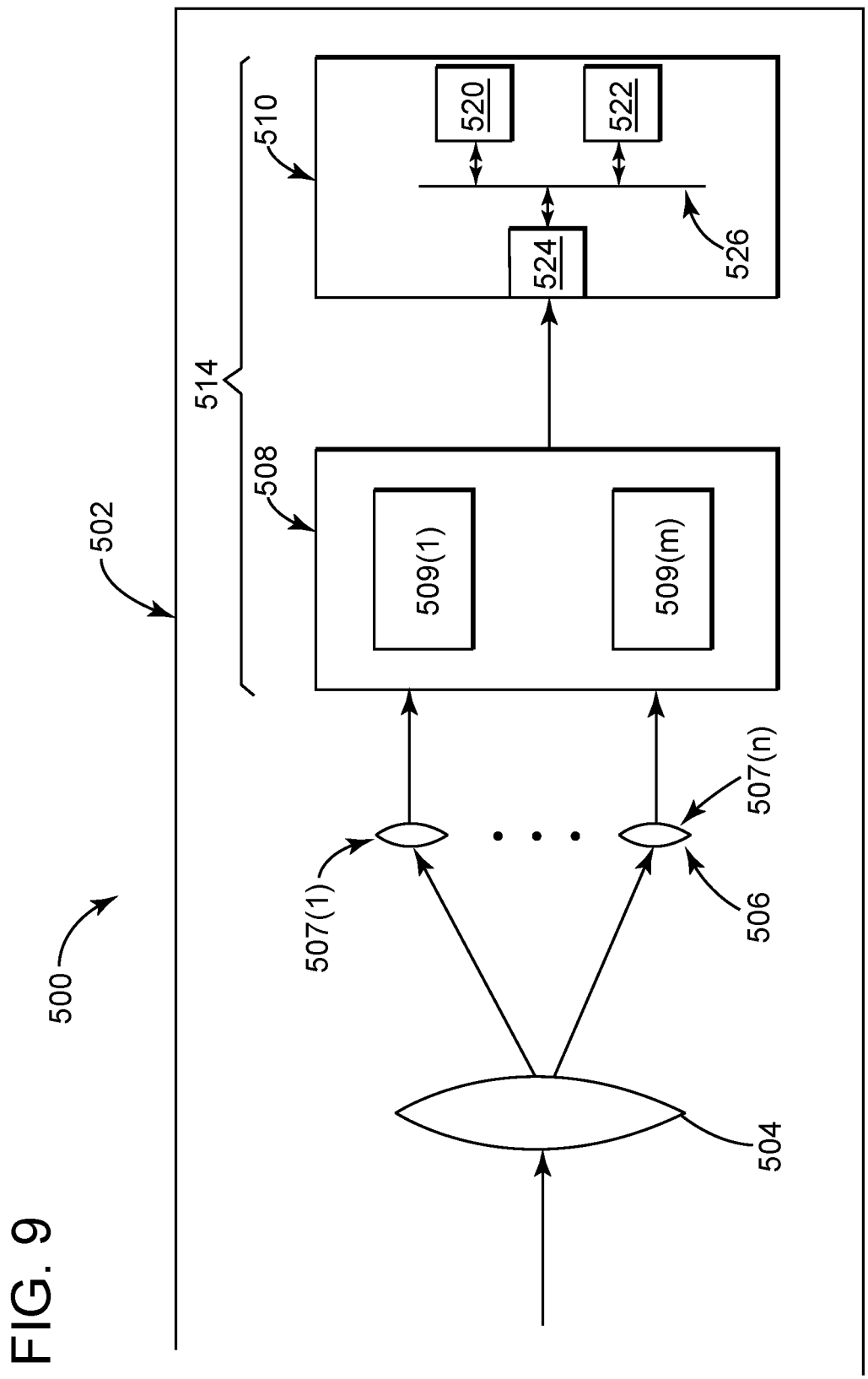
FIG. 9 depicts a block diagram of an exemplary trajectory detection device including an exemplary controller in accordance with the present invention.
Figure 10:
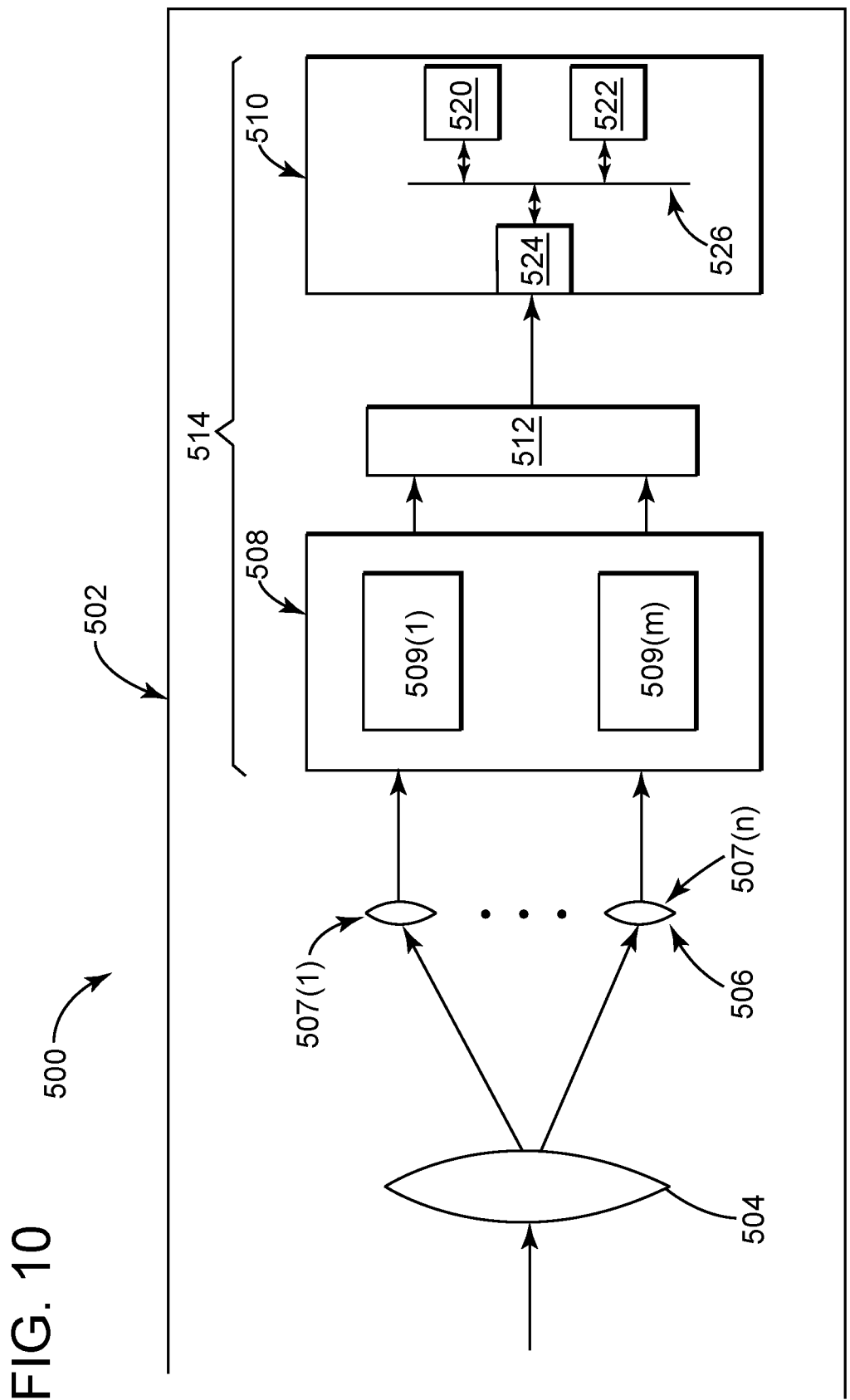
FIG. 10 depicts a block diagram of the exemplary trajectory detection device of FIG. 9 including a plurality of modulators in accordance with the present invention.

Referring to FIGS. 9 and 10, an exemplary trajectory detection device 500 of the present technology is illustrated in FIGS. 9 and 10. In this example, the trajectory detection device 500 includes a plenoptic camera 502. The plenoptic camera 502 includes a main lens 504, a microlens array 506, a detector array 508, and a read-out integrated circuit (ROIC) 510, which may also be referred to herein as a controller 510. The trajectory detection device 500 may also include other types and/or numbers of devices, elements, and/or components in other configurations, such as a plurality of modulators 512 as shown in FIG. 10, as well as analog to digital converters (ADC) or other hardware, and additional optics. The plurality of modulators 512 may also be an integral component, or subsystem, of the ROIC 510. In one example, the trajectory detection device 500 is provided in a single, compact package. Moreover, the combination of the detector array 508 and the ROIC 510 of the exemplary trajectory detection device 500 provides an extremely compact, power optimized, software configurable digital focal plane array (DFPA) 514 that may be utilized in a number of image capture applications, including hostile fire detection.

Referring more specifically to FIG. 9, the main lens 504 is configured to receive an image from an object of interest in the field of view of the main lens 504. The main lens 504, in this example, is a single acquisition lens and may be any type of lens suitable for utilization in plenoptic light field camera 502. The main lens 504 is positioned to receive the image and transmit the received image to the microlens array 506.

The microlens array 506 includes a plurality of microlenses 507(1)-507(n). Each of the plurality of microlenses 507(1)-507(n) in the microlens array 506 is optically coupled to the main lens 504. In one example, the microlens array 506 is located in the short focal length of the lens 504, such that the object plane separation is large and the object is imaged from multiple angles.

The microlens array 506 is configured to create an array of light field images based on the image received through the main lens 504. The light field is a function that describes the light rays at every point in space. The light field is parameterized as a four-dimensional function, such as $L(u,v,s,t)$ that describes light rays crossing planes (u,v) and (s,t). Each of the plurality of microlenses 507(1)-507(n) captures information from rays (photons) from the lens 504 corresponding to different perspectives of the object.

In one example, each of the plurality of microlenses 507(1)-507(n) in the microlens array 506 has one of an infrared pass coating or an infrared block coating located thereon, although other coatings depending on the desired spectral band including RGB, near infrared, short wavelength infrared, mid-wavelength infrared, and long-wavelength infrared. The plurality of microlenses 507(1)-507(n) may have multiple different radii and/or focal lengths within the microlens array 506.

The detector array 508 includes a plurality of detectors (i.e., photodetectors) 509(1)-509(m). The total number "m" of detectors 509 is substantially larger than the total number "n" of microlenses 506, such that there are a plurality of detectors 509 associated with each microlens 506. Each of the plurality of detectors 509(1)-509(m) in the detector array 508 is optically coupled to at least one of the plurality of microlenses 507(1)-507(n) in the microlens array 506 to collect the light field images provided by the plurality of microlenses 507(1)-507(n). The detector array 508 is positioned with respect to the microlens array 506 to collect the array of light field images generated by the microlens array 506.

The detector array 508, which comprises a plurality of photon sensitive photodetectors (detectors) 509 associated with each microlens 507, is optically coupled to the array of microlenses 506 to collect the photons comprising the array of light field images. The detector array 508 is configured to provide output signals from each photodetector (or detector) 509 based on the number of photons hitting the photodetector from at least one microlens 507 of the microlens array 506. In one example, the detector array 508 is a 100×100 silicon photodiode array, although detector arrays with other types and/or numbers of detectors in other dimensions may be utilized. The output signals from each photodetector 509 of the detector array 508 provide light field data including a mosaic of images that are not human consumable. In one example, the plurality of detectors 509(1)-509(m) in the detector array 508 may be all photodiodes or all microbolometers, although other types and/or numbers of detectors may be utilized in the detector array 508. In one example, the detector array 508 integrates long-wave infrared with near-infrared signals and/or RGBD signals to provide multi-spectral capability for the trajectory detection device 500.

The ROIC (or controller) 510 is communicatively coupled to the detector array 508 to form the digital focal point array 514. In one example, the detector array 508 is coupled to the read-out-integrated circuit (ROIC) 510 that includes one or more high signal-to-noise (SNR) ratio analog to digital converters to convert the analog signals from the detector array 508 to digital signals for processing outside the ROIC 510.

Referring now more specifically to FIGS. 9 and 10, the ROIC (or controller) 510 in this example includes one or more processor(s) 520, a memory 522, and/or a communication interface 524, which are coupled together by a bus 526 or other communication link, although the controller 510 can include other types and/or numbers of elements in other configurations. The processor(s) 520 of the controller 510 may execute programmed instructions stored in the memory 522 for the any number of the functions described and illustrated herein. In one example, the processor(s) 520 receive light field intensity and angular data from the detector array 508 and transforms the data into a two-dimensional RGB image, a depth image, and an infrared image. In one example, the processor(s) 520 further apply temporal filtering to the light field data to generate a three-dimensional trajectory for an object in a series of captured images. The processor(s) 520 may include one or more CPUs, GPUs or general-purpose processors with one or more processing cores, for example, although other types of processor(s) can also be used.

The memory 522 stores these programmed instructions for one or more aspects of the present technology as described and illustrated herein, although some or all of the programmed instructions could be stored elsewhere. A variety of different types of memory storage devices, such as random access memory (RAM), read only memory (ROM), hard disk, solid state drives, flash memory, or other computer readable medium which is read from and written to by a magnetic, optical, or other reading and writing system that is coupled to the processor(s) 520, can be used for the memory 522.

Accordingly, the memory 522 of the controller 510 can store one or more applications or programs that can include computer executable instructions that, when executed by the controller 510, cause the controller 510 to perform actions described and illustrated below with reference to FIG. 11. The application(s) can be implemented as modules or components of other applications. Further, the application(s) can be implemented as operating system extensions, module, plugins, or the like.

Even further, the application(s) may be operative in a cloud-based computing environment. The application(s) can be executed within or as virtual machine(s) or virtual server(s) that may be managed in a cloud-based computing environment. Also, the application(s) may be running in one or more virtual machines (VMs) executing on the controller 510.

The communication interface 524 operatively couples and communicates between the controller 510 and the detector array 508. In another example, the controller 510 is a highly integrated microcontroller device with a variety of on-board hardware functions, such as analog to digital converters, digital to analog converters, serial buses, general purpose I/O pins, RAM, and ROM.

Although the exemplary controller 510 is described and illustrated herein, other types and/or numbers of systems, devices, components, and/or elements in other topologies can be used. It is to be understood that the systems of the examples described herein are for exemplary purposes, as many variations of the specific hardware and software used to implement the examples are possible, as will be appreciated by those skilled in the relevant art(s).

In addition, two or more computing systems or devices can be substituted for the controller 510. Accordingly, principles and advantages of distributed processing, such as redundancy and replication also can be implemented, as desired, to increase the robustness and performance of the devices and systems of the examples. The examples may also be implemented on computer system(s) that extend across any suitable network using any suitable interface mechanisms and traffic technologies, including by way of example only teletraffic in any suitable form (e.g., voice and modem), wireless traffic networks, cellular traffic networks, Packet Data Networks (PDNs), the Internet, intranets, and combinations thereof.

The examples may also be embodied as one or more non-transitory computer readable media having instructions stored thereon for one or more aspects of the present technology as described and illustrated by way of the examples herein. The instructions in some examples include executable code that, when executed by one or more processors, cause the processors to carry out steps necessary to implement the methods of the examples of this technology that are described and illustrated herein.

Figure 11:
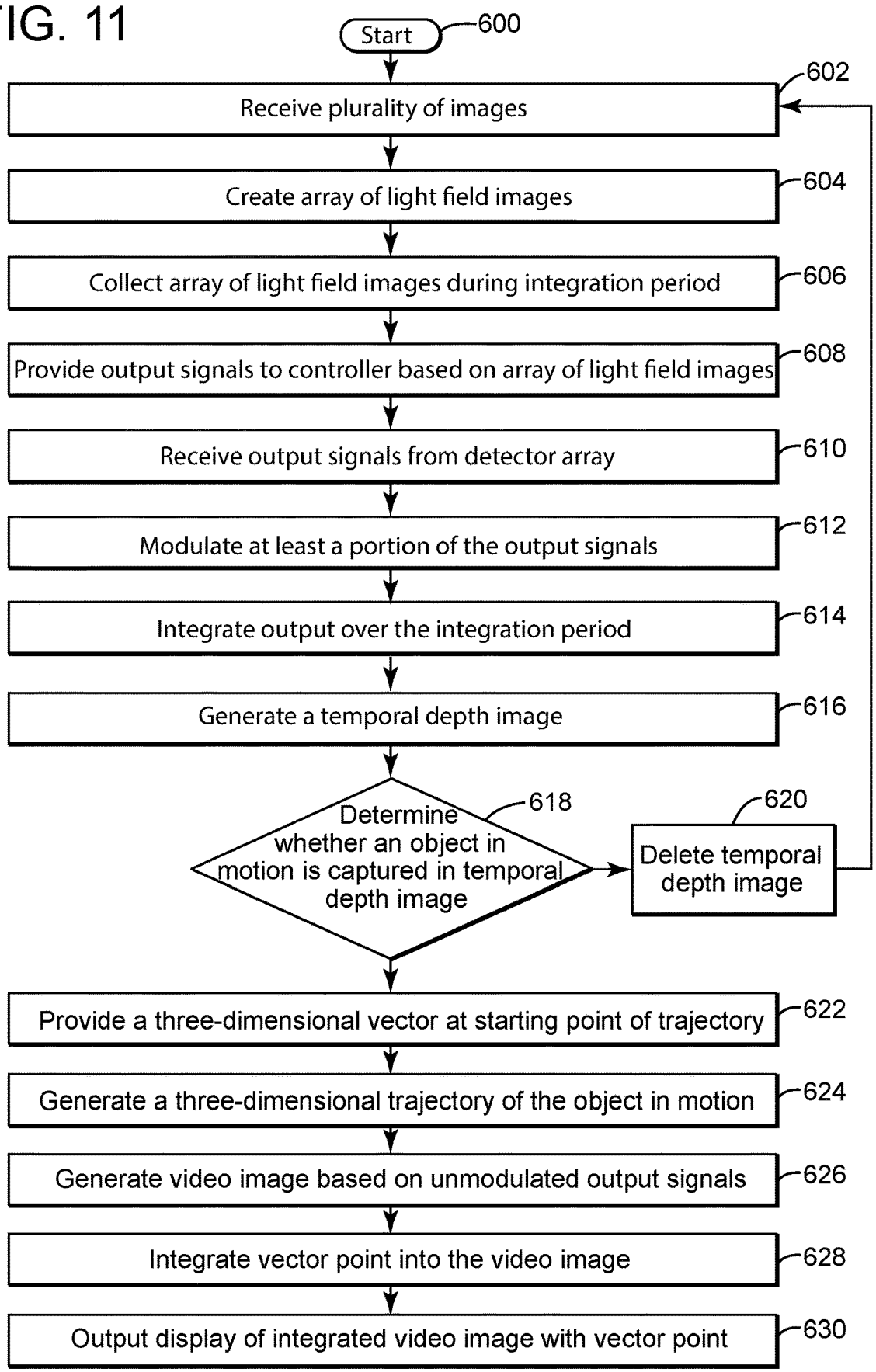
FIG. 11 depicts a flowchart of an exemplary method of determining a three-dimensional trajectory of an object in motion in accordance with the present invention.

In one example, as shown in FIG. 11, the trajectory detection device 500 further includes a plurality of modulators 512. The plurality of modulators 512 may also be an integral component, or subsystem, of the ROIC (controller) 510. Each of the plurality of modulators 512 are coupled to a corresponding detector 509 in the detector array 508. Each of the plurality of modulators 512 are configured to modulate the output signal from the corresponding detector 509 of the detector array 508. The plurality of modulators 512 can be utilized to modulate the analog signals from the detector array 508 prior to digital conversion for processing by the controller 510. In one example, each of the plurality of modulators 512 are configured to provide a modulating frequency having a modulating frequency cycle time that is smaller than the integration (frame) time of the image acquisition for the trajectory detection device 500. In one example, the modulating frequency provided by the plurality of modulators 512 has a modulating frequency cycle time that is at least 10, at least 25, at least 50, at least 100 or more times smaller than the integration period.

An exemplary operation of the trajectory detection device 500 of the present technology will now be described with reference to FIG. 11. In step 600, the trajectory detection method is started.

In step 602 a plurality of light photons emanating from an object (not shown) in the field of view of the lens, wherein the photons comprise an image of the object, are received through the lens 504 of the trajectory detection device 500 over an integration (or shutter actuation) period. The integration period, or frame time, may be varied based on the application. The trajectory detection device 500 may have a number of capture modes including RGB, infrared, RGBD, depth, and/or real-time temporal depth. The trajectory detection device 500 may advantageously capture multi-spectral images in low-light applications. The trajectory detection device 500 may receive any types and/or number of images and may be used for applications including night vision goggles, unmanned drone three-dimensional surface mapping, three-dimensional enhanced facial recognition, virtual or augmented reality, and/or three-dimensional thermal surface mapping, by way of example only.

In step 604, the microlens array 506 creates an array of light field images based on the image received through the lens 504 of the trajectory detection device 500. Each light field image comprises a subset of the photons emanating from the object in the field of view of the lens 504. Each of the plurality of microlenses 507(1)-507(n) captures information from photons received from the lens 504 corresponding to different angles and positions on the object of interest that can be utilized to digitally refocus at a different depth of field or digitally change perspective after an image has been captured. The plurality of microlenses 507(1)-507(n) in the microlens array 506 may have various coatings, such as an infrared pass coating or an infrared block coating located thereon, to provide information for particular spectral bands. Other coatings may be utilized to generate a multi-spectral light field array including, by way of example only, RGB, near infrared, short wavelength infrared, mid-wavelength infrared, and long-wavelength infrared. In one example, each of the plurality of microlenses 507(1)-507(n) in the microlens array 506 is independently coated for a spectral band to provide an overlapping mosaic of "stereo" images without creating gaps in the individual band spatial coverage.

In step 606, the detector array 508, comprising a plurality of photon sensitive photodetectors (detectors) 509 associated with each microlens 507, collects the photons comprising the array of light field images from the microlens array 506 received during the integration period. The detector array 508 may be configured to collect the array of light field images over an integration period for further processing, by way of example.

In step 608, the detector array 508 provides output signals from each of the photodetectors 509 to the controller 510 that are based on the number of photons hitting the photodetectors 509 from an associated microlens 507. The output signals from the detector array 508 provide light field intensity and angular data, which can be processed with computational imaging techniques to provide a mosaic of images that may or may not be human consumable. In one example, the detector array 508 provides multi-spectral data that integrates long-wave infrared and/or near-infrared signals with RGBD signals to provide multi-spectral capability for the trajectory detection device 500, by way of example only.

In step 610, the controller 510 receives the output signals from the detector array 508. In one example, the controller (or ROIC) 510 receives the output signals from the detector array 508 that includes one or more high signal to noise ratio analog to digital converters to convert the analog signals from the detector array 508 to digital signals for processing by the controller 510.

In step 612, the controller 510 modulates at least a portion of the output signals from each photodetector 509 at a modulating frequency having a modulation frequency cycle time that is smaller than the integration period. In one example, the output signals are modulated such that, for substantially a first half of the modulating frequency cycle time, the output signals generated from each photodetector 509 are integrated and to added to a total integrated signal output generated from each photodetector 509 during the modulating frequency cycle time, and for substantially a second half of the modulating frequency cycle time, the output signals generated from each photodetector 509 are integrated to and subtracted from the total integrated signal output generated from each photodetector 509 during the modulating frequency cycle time. In another example, at least a portion of the output signals are modulated using the plurality of modulators 512, which modulate the analog signals from the detector array 508 prior to being converted to digital signals for processing by the controller 510. By modulating the output signals at a modulating frequency cycle time that is smaller than the integration (frame) time, the constant illumination portions of the image are attenuated leaving only the portion of the image of the object in motion at a high rate. In one example, the modulating frequency cycle time is at least 50 times smaller than the integration period.

In step 614, the controller 510 integrates the output signals over the integration period. Integrating the output signals allows for the generation of a temporal depth image (for purposes herein, temporal depth images may include three dimensional images) in step 616. Any suitable integration period may be utilized.

In step 616, the controller 510 generates a temporal depth image based on the integration of the modulated output signals from the detector array 508 performed in step 614. Applying the modulation to a portion of the output signals in the light field provided by the microlens array 506 allows for generation of the temporal depth image, which will display a trajectory of an object in motion captured in the temporal depth image, including the Z-dimension. The Z-axis herein being an axis that is perpendicular to an object plane, such as object plane 116 in FIG. 2A. Information and/or distances in the Z-axis are representative of depth or range in a three dimensional image.

In step 618, in a hostile fire detection mode, the controller 510 determines whether an object in motion is captured in the temporal depth image. When the controller 510 determines that an object in motion is not captured in the temporal depth image, the No branch is taken to step 620 where the controller 510 deletes the temporal depth image and the method returns to step 602 to obtain a plurality of images. When no object motion is detected, the data is deleted which allows the controller 510 to more efficiently process the large amounts of data required and allows for the transmission of only relevant information by the trajectory detection device 500. When the controller 510 determines that an object in motion is captured in the temporal depth image, the Yes branch is taken to step 622.

In step 622, the controller 510 processes the light field temporal image to provide a three-dimensional motion vector for each photodetector of the image. For example, the motion detector may be color coded, wherein mid gray represents no motion, white represents positive (object entered photodetector) motion and black represents negative (object left photodetector) motion. The path of objects across the field of view of the lens 504 of the trajectory detection device 500 can be traced over the integration period. The path can then be triangulated to generate the starting point motion vector, although other techniques may be employed to generate the motion vector. In step 624, the controller 510 generates a plurality of motion vectors which indicate a three-dimensional trajectory of the object in motion in the plurality of images received through the lens 504 based on the temporal depth image generated in step 616 including the three-dimensional motion vector in step 622.

In step 626, the controller 510 generates a video image based on at least a portion of the unmodulated output signals from the detector array 508. The video image is generated using RGBD image data obtained by the detector array 508. The video image is generated using known techniques.

In step 628, the controller 510 integrates the motion vectors of the object in motion generated in steps 622 and 624 into the video image generated in step 626. As a result, the starting point and object trajectory are presented as actionable information in the generated video image. In step 630, the controller 510 outputs a display of the integrated video image including the starting point motion vector pointing to the starting point of the object in motion, as well as the motion vectors indicating the three-dimensional trajectory of the object in motion over the integration period.

Accordingly, examples of the present technology provide a trajectory detection device that provides multi-spectral trajectory detection. The technology utilizes a detector array 508 and a microlens array 506 to generate a light field camera with extended depth-of-field and RGB+depth (RGBD) capability. The technology further employs temporal filtering applied to the light field images to allow for three-dimensional trajectory detection for an object in motion. The technology may advantageously be utilized in low light and surveillance applications for trajectory detection, including in night vision goggles or gun sights, by way of example only.

Figure 12:
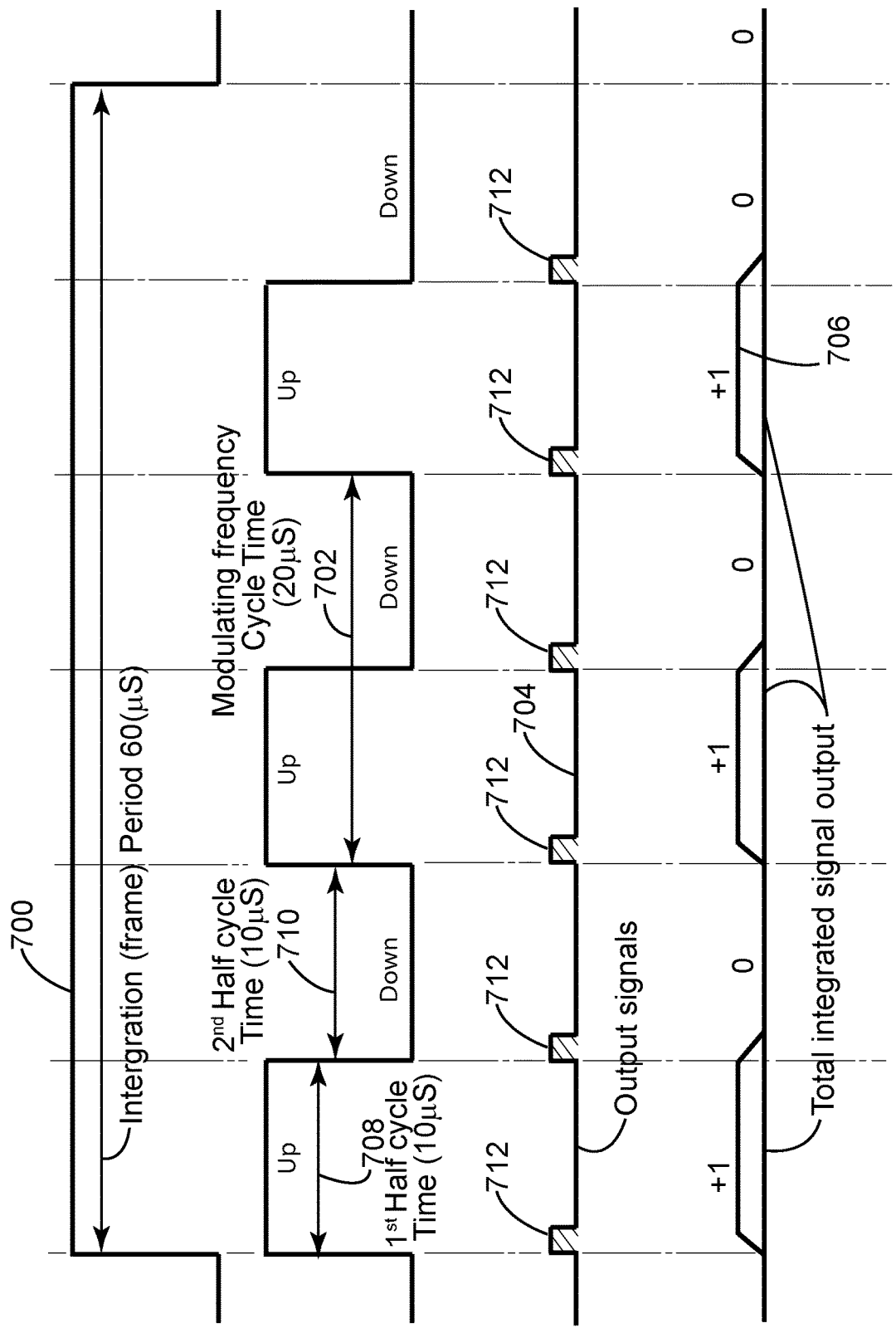
FIG. 12 depicts simplified examples of timing diagrams in accordance with the present invention, wherein a field of view has a relatively constant light photon output.
Figure 13:
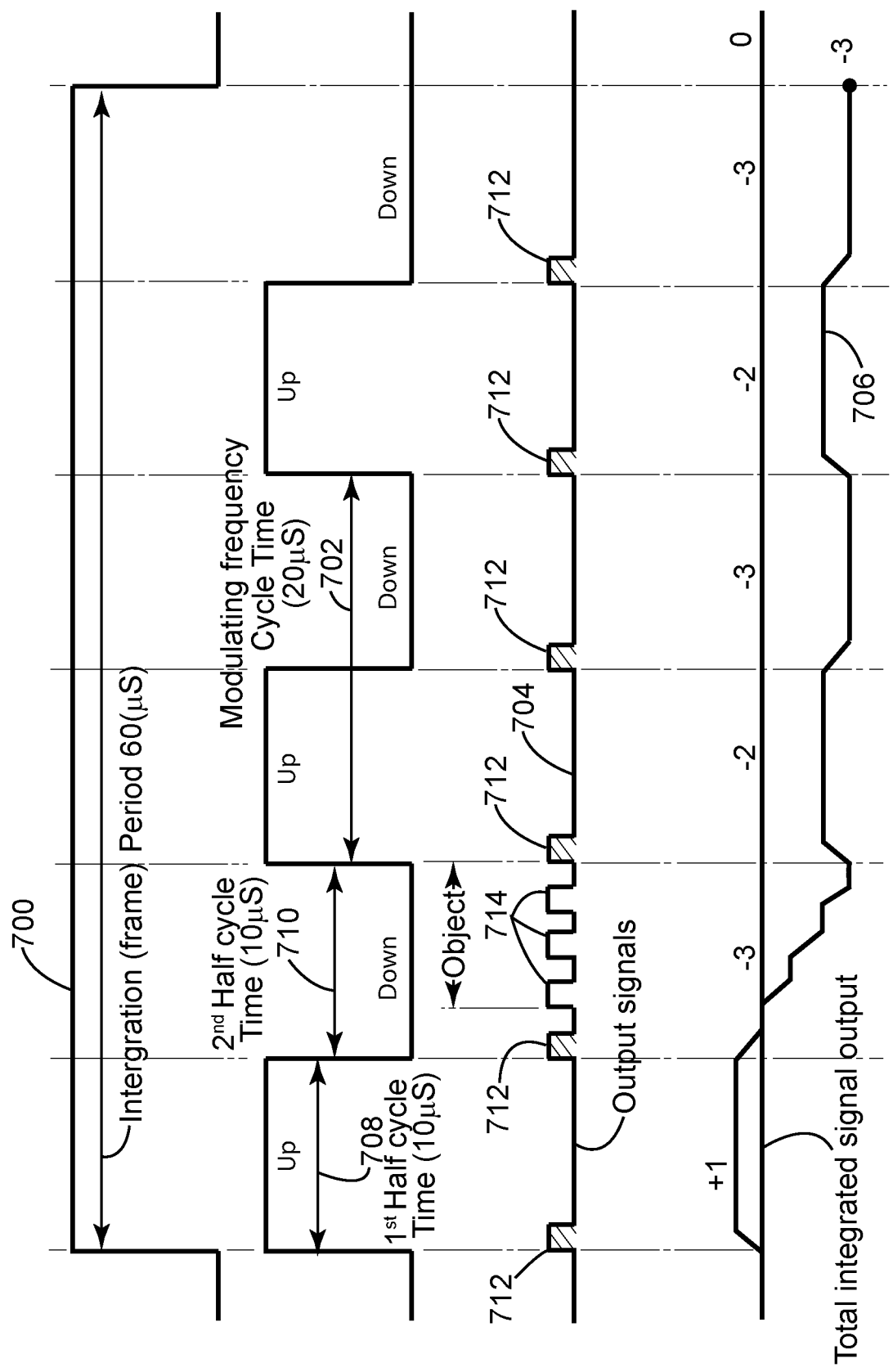
FIG. 13 depicts simplified examples of the timing diagrams of FIG. 12 in accordance with the present invention, wherein a high-speed object has entered the field of view.

Referring to FIGS. 12 and 13, simplified examples of timing diagrams of the integration period 700, the modulating period (or modulating frequency cycle time) 702, the output signal 704 from a photodetector 509, and the total integrated signal output 706 in accordance with the present invention are depicted. More specifically, FIG. 12 depicts the timing diagrams 700, 702, 704, 706 with a field of view that has a relatively constant light photon output (such as a field of snow). Also, more specifically, FIG. 13 depicts the timing diagrams 700, 702, 704, 706 with the same field of view in which a high-speed object (such as a bullet) has entered the field of view. By extrapolating the motion vector back, it is possible to determine the starting location and therefor the location of the shooter (where to return fire).

Referring specifically to FIG. 12, the integration period (or frame time) 700 for this example is set at 60 micro seconds (µs). Also, the modulating frequency cycle time 702 is set at 20 μs. For this particular example, the modulating frequency cycle time 702 is substantially constant. The modulating frequency cycle time 702 starts at the beginning of the frame time. The modulating frequency cycle has a substantially 50/50 duty cycle, which means that the modulating frequency cycle time 702 will have a first half cycle time 708 of substantially 10 μs and a second half cycle time 710 of substantially 10 μs in this example. For each half cycle 708, 710, the total signal integrated output 706 is alternately integrated to add and subtract respectively the output signals generated by photons hitting the photodetectors.

If the field of view is generating background photons 712 at the rate of 1 photon per 10 μs, then for each first half cycle 708, the total integrated signal output 706 will be integrated to add a signal output indicative of plus 1 photon, and for each second half cycle 710, the total integrated signal output 706 will be integrated to subtract a signal output indicative of minus 1 photon. The net result at the end of the frame time 700 is a zero total integrated signal output 706. In other words, the constant background photons are filtered out of the image data.

Referring specifically to FIG. 13, a high-speed object (such as a bullet) now enters the field of view during a second half cycle 710. The high-speed object, in this example, generates high speed object photons 714 during that second half cycle 701 at the rate of three photons per 10 μs. As such, the net result at the end of the frame time is a minus three total integrated signal output 706. Accordingly, the alternating plus and minus integrations of the output signals 714, 712 during the modulating cycle will act as a high pass filter to substantially filter out the background photons 712 and capture substantially only the high-speed object photons 714.

The timing and functionality of the integration period (electronic shutter actuation time), output signal modulation cycle, and signal integration, that are represented by timing diagrams 700, 702, 704 and 706, may be implemented through the utilization and/or combination of several electronic components, systems and methods. For example, one such system for performing similar signal modulation and integration functions is described in U.S. Pat. No. 9,917,593 to Petilli, filed on Dec. 16, 2016, and titled: "Logarithmic Analog To Digital Converter Devices and Methods Thereof", which is herein incorporated by reference in its entirety.

By utilizing various embodiments of plenoptic cameras such as plenoptic cameras 100, 200, 300, 400 and 500, high speed objects (such as a bullet) can be detected and traced back to its source. This can be done whether the object is moving across the field of view or is approaching straight on in the field of view. In other words, object detection trajectory devices of the present invention that utilized plenoptic cameras, such as plenoptic cameras 100, 200, 300, 400 and 500, can provide three dimensional information and vectors of the objects that they detect that a conventional camera system could not.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A trajectory detection device comprising:
a lens configured to receive an image of a field of view of the lens;
an array of microlenses optically coupled to the lens and configured to create an array of light field images based on the image;
a detector array comprising a plurality of photon sensitive photodetectors, the detector array being optically coupled to the array of microlenses and configured to generate output signals from each photodetector based on the array of light field images; and
a controller communicatively coupled to the detector array and configured to:
receive the output signals from the detector array;
integrate the output signals over an integration period, wherein at least a portion of the output signals are modulated at a modulating frequency having a modulating frequency cycle time that is smaller than the integration period; and
generate a three-dimensional image of motion within the field of view based on the integration of the modulated output signals.

2. The device of claim 1, wherein the output signals are modulated such that, for substantially a first half of the modulating frequency cycle time, the output signals generated from each photodetector are integrated to added to a total integrated signal output generated from each photodetector during the modulating frequency cycle time, and for substantially a second half of the modulating frequency cycle time, the output signals generated from each photodetector are integrated to subtracted from the total integrated signal output generated from each photodetector during the modulating frequency cycle time.

3. The device of claim 1, wherein the detector array comprises a plurality of quantum dots.

4. The device of claim 1, wherein each microlens in the array of microlenses has one of an infrared pass coating or an infrared block coating thereon.

5. The device of claim 1, wherein the detector array comprises a plurality of photovoltaic photodetectors.

6. The device of claim 1, wherein the controller is configured to process the three-dimensional image to provide a three-dimensional vector pointing to a starting point of the object in motion.

7. The detection device of claim 1, wherein the image of an object in motion is further processed to extract motion vectors.

8. The device of claim 1, wherein controller is configured to:
determine whether an object in motion is captured in the three-dimensional image; and
delete the three-dimensional image when the object in motion is not captured in the three dimensional image.

9. The device of claim 1, wherein the modulating frequency has a modulating frequency cycle time that is at least 10 times smaller than the integration period.

10. The device of claim 1, wherein the detector array comprises a plurality of non-silicon based photodetectors.

11. The device of claim 1, wherein the detector array is cooled to a temperature range of between 77 Kelvin and 180 Kelvin.

12. The device of claim 1, wherein the detector array comprises a plurality of photodetectors sensitive to light bands in one of the SWIR range, MWIR range and LWIR range.

13. A method of determining a three-dimensional trajectory of motion, the method comprising:
   receiving, through a lens, an image of a field of view of the lens;
   creating an array of light field images based on the image, from an array of microlenses optically coupled to the lens;
   generating output signals, from photodetectors of a detector array optically coupled to the array of microlenses, based on the array of light field images;
   integrating, through a controller coupled to the detector array, the output signals over an integration period wherein at least a portion of the output signals are modulated at a modulating frequency having a modulating frequency cycle time that is smaller than the integration period; and
   generating an image of motion in the field of view based on the integration of the modulated output signals, wherein the image displays a three dimensional trajectory of the motion.

14. The method of claim 13 comprising:
   modulating the output signals such that, for substantially a first half of the modulating frequency cycle time, the output signals generated from each photodetector are integrated to added to a total integrated signal output generated from each photodetector during the modulating frequency cycle time, and for substantially a second half of the modulating frequency cycle time, the output signals generated from each photodetector are integrated to subtracted from the total integrated signal output generated from each photodetector during the modulating frequency cycle time.

15. The method of claim 13 comprising:
   providing the detector array such that the photodetectors comprise a plurality of quantum dots.

16. The method of claim 13 comprising:
   providing the detector array such that the photodetectors comprise a plurality of photovoltaic photodetectors.

17. The method of claim 13 comprising:
   providing the detector array such that the photodetectors comprise a plurality of non-silicon based photodetectors.

18. The method of claim 13 comprising:
   cooling the detector array to a temperature range of between 77 Kelvin and 180 Kelvin.

19. The method of claim 13 wherein the modulating frequency has a modulating frequency cycle time that is at least 10 times smaller than the integration period.

20. The method of claim 13 wherein the detector array comprises a plurality of photodetectors sensitive to light bands in one of the SWIR range, MWIR range and LWIR range.

* * * * *